United States Patent
Chen et al.

(10) Patent No.: US 9,613,952 B2
(45) Date of Patent: Apr. 4, 2017

(54) SEMICONDUCTOR ESD PROTECTION DEVICE

(71) Applicant: Macronix International Co., Ltd., Hsinchu (TW)

(72) Inventors: Hsin-Liang Chen, Taipei (TW); Wing-Chor Chan, Hsinchu (TW); Shyi-Yuan Wu, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 342 days.

(21) Appl. No.: 14/341,295

(22) Filed: Jul. 25, 2014

(65) Prior Publication Data

US 2016/0027773 A1     Jan. 28, 2016

(51) Int. Cl.
*H01L 27/02* (2006.01)
*H01L 27/088* (2006.01)
*H01L 29/78* (2006.01)
*H01L 21/8234* (2006.01)

(52) U.S. Cl.
CPC ........ *H01L 27/088* (2013.01); *H01L 27/0207* (2013.01); *H01L 27/0251* (2013.01); *H01L 27/0266* (2013.01); *H01L 27/0274* (2013.01); *H01L 27/0296* (2013.01); *H01L 29/7816* (2013.01); *H01L 21/823418* (2013.01)

(58) Field of Classification Search
CPC ............. H01L 27/0266; H01L 27/0274; H01L 27/0296
See application file for complete search history.

(56) References Cited

U.S. PATENT DOCUMENTS

| | | | | |
|---|---|---|---|---|
| 4,980,746 A | * | 12/1990 | Harrington, III | H02J 9/061 257/369 |
| 5,173,755 A | * | 12/1992 | Co | H01L 27/0251 257/296 |
| 5,623,156 A | * | 4/1997 | Watt | H01L 27/0251 257/173 |
| 5,905,287 A | * | 5/1999 | Hirata | H01L 27/0266 257/355 |
| 6,229,186 B1 | * | 5/2001 | Ishida | G11C 11/412 257/206 |

(Continued)

*Primary Examiner* — Evan Pert
(74) *Attorney, Agent, or Firm* — Finnegan, Henderson, Farabow, Garrett & Dunner LLP (57) ABSTRACT

A semiconductor device includes high-voltage (HV) and low-voltage (LV) MOS's formed in a substrate. The HV MOS includes a first semiconductor region having a first-type conductivity and a first doping level, a second semiconductor region having the first-type conductivity and a second doping level lower than the first doping level, a third semiconductor region having a second-type conductivity, and a fourth semiconductor region having the first-type conductivity. The first, second, third, and fourth semiconductor regions are arranged along a first direction, and are drain, drift, channel, and source regions, respectively, of the HV MOS. The LV MOS includes the fourth semiconductor region, a fifth semiconductor region having the second-type conductivity, and a sixth semiconductor region having the first-type conductivity. The fourth, fifth, and sixth semiconductor regions are arranged along a second direction different from the first direction, and are drain, channel, and source regions, respectively, of the LV MOS.

20 Claims, 8 Drawing Sheets

(56) References Cited

U.S. PATENT DOCUMENTS

| | | | |
|---|---|---|---|
| 6,414,360 B1* | 7/2002 | Gardner | H01L 27/0251 257/369 |
| 2002/0195654 A1 | 12/2002 | Kwon | |
| 2004/0238913 A1 | 12/2004 | Kwon et al. | |
| 2008/0048266 A1* | 2/2008 | Russ | H01L 27/0274 257/355 |
| 2012/0241900 A1 | 9/2012 | Chen et al. | |
| 2012/0286362 A1 | 11/2012 | Chan et al. | |

* cited by examiner

SEMICONDUCTOR ESD PROTECTION DEVICE

TECHNOLOGY FIELD

The disclosure relates to semiconductor devices and, more particularly, to high voltage electrostatic discharge (ESD) protection devices.

BACKGROUND

Bipolar-CMOS-DMOS (BCD, where CMOS stands for "complementary metal-on-semiconductor" and DMOS stands for "double-diffused metal-on-semiconductor") and triple well process have been widely used in high-voltage (HV) applications, such as electrostatic discharge (ESD) protection. Generally, the ESD performance of an HV ESD protection device depends on total width of gates of the device, as well as surface or lateral rules of the device. For HV ESD protection devices with smaller sizes, the surface-bulk ratio is larger as compared to devices with larger sizes, and thus the surface has a larger impact on device performance. As a result, obtaining good ESD performance in devices having relatively small sizes is more challenging. Further, as the operation voltage of a device increases, on-chip ESD protection design also becomes more challenging.

An HV ESD protection device typically has a low on-state resistance ($R_{DS-on}$). When ESD occurs, the ESD current is more likely to concentrate near the surface or the drain of the HV protection device. This results in high current density and electric field at surface junction regions, and causes physical damage to these regions. As a result, the surface of the HV protection device may have a larger impact on its performance as compared to a device having a larger on-state resistance, and thus surface or lateral rules play a more important role in the HV protection device.

Other characteristics of an HV protection device include, for example, a high breakdown voltage, which is always higher than an operation voltage of the HV protection device. Further, a trigger voltage ($V_{t1}$) of the HV device is often much higher than the breakdown voltage of the HV device. Therefore, during an ESD event, the device or internal circuit being protected (also referred to as the "protected device/circuit") may face the risk of being damaged before the HV protection device ever turns on to provide ESD protection. Conventionally, to reduce the trigger voltage of the HV protection device, an additional external ESD detection circuit may be needed.

The HV protection device usually has a low holding voltage, which may result in the HV protection device being triggered by unwanted noise, a power-on peak voltage, or a surge voltage. As a result, latch-up may occur during normal operation.

Further, there may be a field plate effect in the HV protection device. That is, an electric field distribution in the HV protection device is sensitive to routing of wirings that connect different elements or different portions of a device. The ESD current is more likely to concentrate near the surface or the drain of the HV device.

SUMMARY

In accordance with the disclosure, there is provided a semiconductor device including a substrate, a high-voltage (HV) metal-on-semiconductor (MOS) structure formed in the substrate, and a low-voltage (LV) MOS structure formed in the substrate. The HV MOS structure includes a first semiconductor region having a first-type conductivity and a first doping level, a second semiconductor region having the first-type conductivity and a second doping level lower than the first doping level, a third semiconductor region having a second-type conductivity, and a fourth semiconductor region having the first-type conductivity. The first, second, third, and fourth semiconductor regions are arranged along a first direction in this order, and are a drain region, a drift region, a channel region, and a source region, respectively, of the HV MOS structure. The LV MOS structure includes the fourth semiconductor region, a fifth semiconductor region having the second-type conductivity, and a sixth semiconductor region having the first-type conductivity. The fourth, fifth, and sixth semiconductor regions are arranged along a second direction different from the first direction in this order, and are a drain region, a channel region, and a source region, respectively, of the LV MOS structure.

Also in accordance with the disclosure, there is provided a semiconductor device including a substrate and a first and a second metal-on-semiconductor (MOS) structure formed in the substrate. The first MOS structure includes a first drain region, a first channel region, and a first source region arranged along a first direction in this order. The second MOS structure includes a second drain region, a second channel region, and a second source region arranged along a second direction different from the first direction in this order. The first source region and the second drain region share a common semiconductor region in the substrate.

Also in accordance with the disclosure, there is provided a semiconductor device including a substrate, and a first, a second, a third, a fourth, a fifth, and a sixth semiconductor regions formed in the substrate. The first, second, third, and fourth semiconductor regions are arranged along a first direction in this order. The fourth, fifth, and sixth semiconductor regions are arranged along a second direction different from the first direction in this order. The first semiconductor region has a first-type conductivity and a first doping level. The second semiconductor region has the first-type conductivity and a second doping level lower than the first doping level. The third semiconductor region has a second-type conductivity. The fourth semiconductor region has the first-type conductivity. The fifth semiconductor region has the second-type conductivity. The sixth semiconductor region has the first-type conductivity.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a high voltage electrostatic discharge (ESD) protection device.

Hereinafter, embodiments consistent with the disclosure will be described with reference to the drawings. Wherever possible, the same reference numbers will be used throughout the drawings to refer to the same or like parts.

Figure 1A:
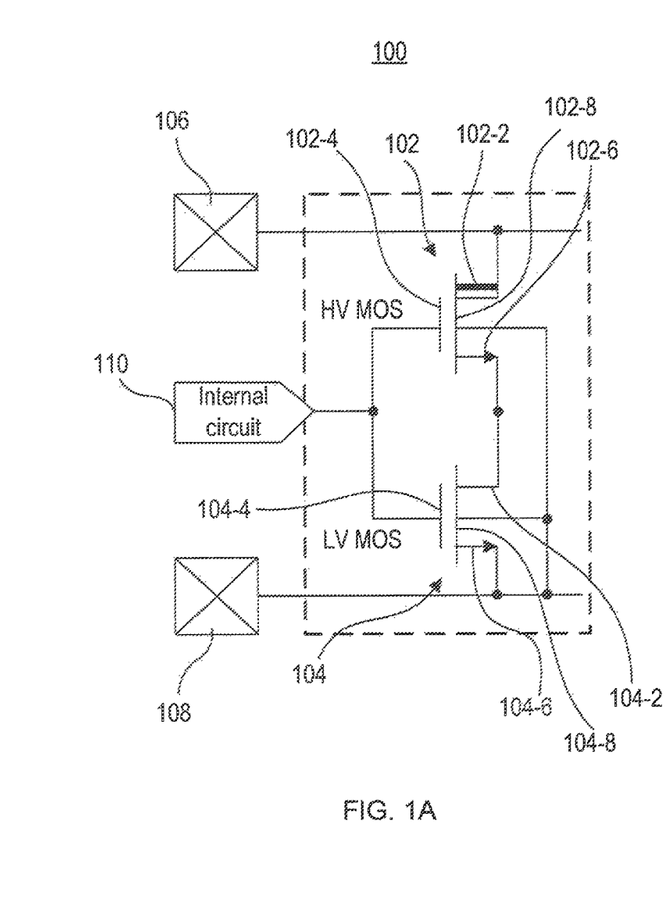
FIGS. 1A-1C are equivalent circuits of an electrostatic discharge (ESD) protection device according to an exemplary embodiment.

FIG. 1A shows an equivalent circuit of an exemplary high-voltage (HV) ESD protection device 100 consistent with the disclosure. The ESD protection device 100 includes a high-voltage (HV) metal-on-semiconductor (MOS) structure 102 and a low-voltage (LV) MOS structure 104 formed in one device, i.e., as described below, the HV MOS structure 102 and the LV MOS structure are electrically coupled to each other without use of metal wiring. In the example shown in FIG. 1A, both the HV MOS structure 102 and the LV MOS structure 104 are N-channel MOS's (NMOS's). In the equivalent circuit shown in FIG. 1A, the HV MOS structure 102 includes a drain (also referred to as "HV drain") 102-2, a gate (also referred to as "HV gate") 102-4, a source (also referred to as "HV source") 102-6, and a body (also referred to as "HV body") 102-8. The LV MOS structure 104 includes a drain (also referred to as "LV drain") 104-2, a gate (also referred to as "LV gate") 104-4, a source (also referred to as "LV source") 104-6, and a body (also referred to as "LV body") 104-8.

As shown in FIG. 1A, the HV drain 102-2 is electrically coupled to a terminal 106 connectable to a power supply (the terminal 106 is also referred to as "power supply terminal"), and the LV source 104-6 is electrically coupled to a terminal 108 connectable to a circuit ground (the terminal 108 is also referred to as "circuit ground terminal"). The HV gate 102-4 and the LV gate 104-4 are electrically coupled to each other and are also electrically coupled to an internal circuit 110 protected by the ESD protection device 100. The HV body 102-8 and the LV body 104-8 are electrically coupled to each other and are also electrically coupled to the circuit ground terminal 108.

In the equivalent circuit shown in FIG. 1A, the HV source 102-6 and the LV drain 104-2 are electrically coupled to each other. As will be described later and consistent with embodiments of the disclosure, the HV source 102-6 and the LV drain 104-2 physically share a common region in the ESD protection device 100. In other words, a common semiconductor region in the ESD protection device 100 serves as both a source region of the HV MOS structure 102 and a drain region of the LV MOS structure 104. Therefore, in a circuit layout of the ESD protection device 100, a wiring connecting the HV drain 102-6 and the LV source 104-2 can be omitted, resulting in a smaller footprint. Consequently, a size of the ESD protection device 100 can be reduced.

Figure 1B:
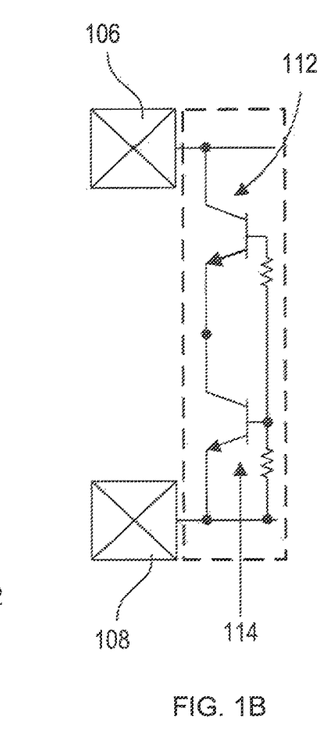
Figure 1C:
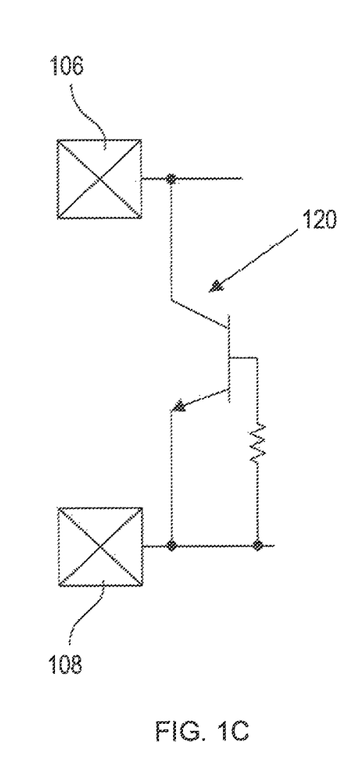

In the ESD protection device 100, each of the HV MOS structure 102 and the LV MOS structure 104 has a parasitic bipolar junction transistor (BJT) associated therewith. In the example shown in FIG. 1A, the parasitic BJT's are NPN BJT's. FIG. 1B shows an equivalent circuit of the parasitic BJT's in the ESD protection device 100. In FIG. 1B, parasitic BJT 112 is associated with the HV MOS structure 102, and parasitic BJT 114 is associated with the LV MOS structure 104. The parasitic BJT's 112 and 114 together are equivalent to a single parasitic BJT 120 electrically coupled between the power supply terminal 106 and the circuit ground terminal 108, as shown in FIG. 1C.

Figure 2:
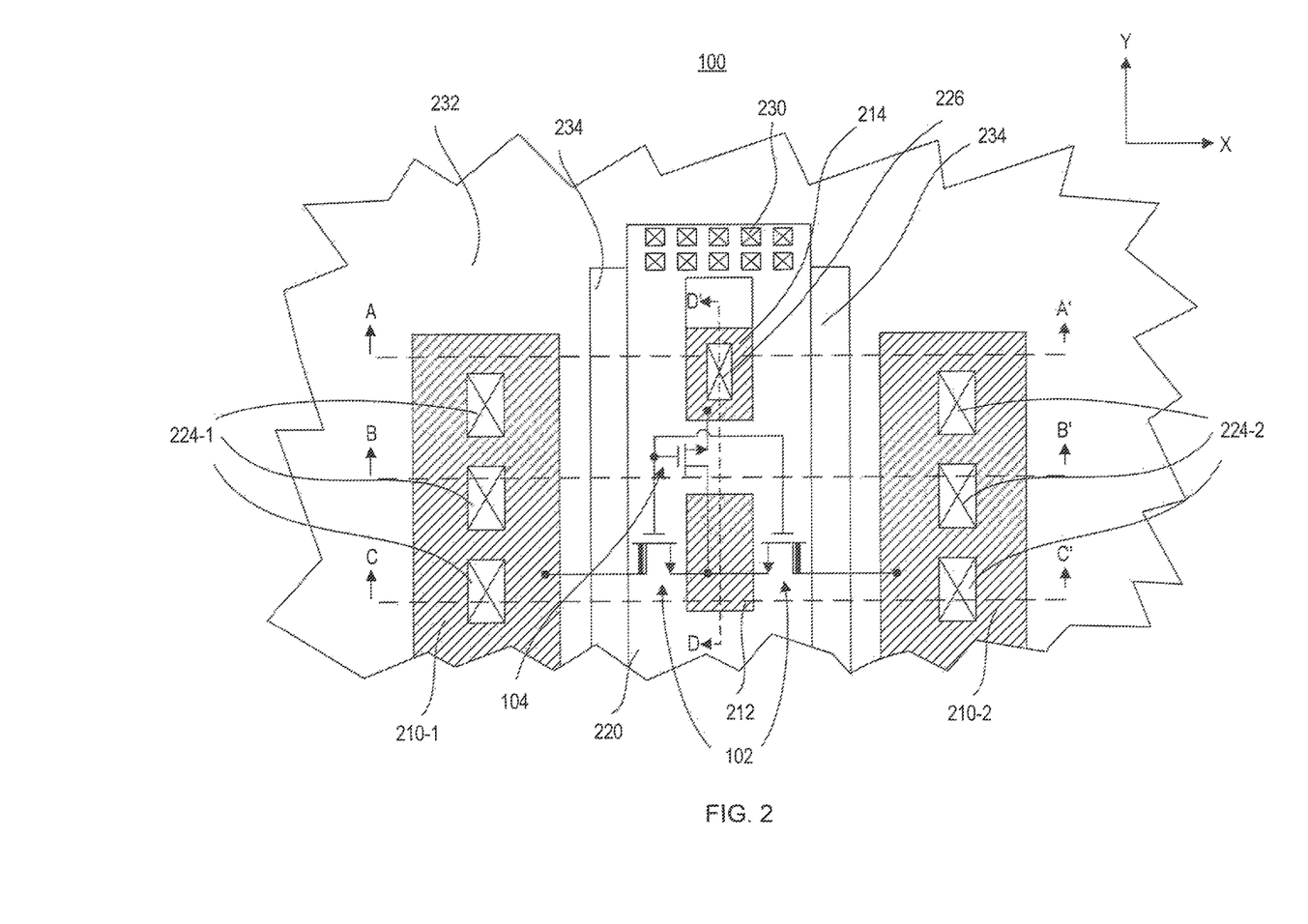
FIG. 2 is a plan view schematically showing a portion of the ESD protection device according to the exemplary embodiment.

FIG. 2 is a plan view schematically showing a portion of the ESD protection device 100. FIGS. 3A, 3B, 30, and 3D are cross-sectional views of the ESD protection device 100 taken along cut-lines AA', BB', CC', and DD', respectively, in FIG. 2. As shown in FIG. 2, the cut-lines AA', BB', and CC' extend along an X-direction and the cut-line DD' extends along a Y-direction. The X-direction is perpendicular to the Y-direction.

Refer to FIGS. 2 and 3A-3D, the ESD protection device 100 includes a P-type substrate 202, an HV N-Well 204 (also labeled as "HVNW" in the figures) formed in the P-type substrate 202, a P-body 206 formed in the HV N-Well 204, and a first N-Well 208-1 and a second N-Well 208-2 (both also labeled as "NW" in the figures) formed in the HV N-Well 204. The first and second N-Wells 208-1 and 208-2 are electrically coupled to the HV N-Well 204. A first $N^+$ region 210-1 and a second $N^+$ region 210-2 are formed in or above the first and second N-Wells 208-1 and 208-2, respectively. The first and second $N^+$ region 210-1 and 210-2 are electrically coupled to the first and second N-Well 208-1 and 208-2, respectively. The ESD protection device 100 also includes a third $N^+$ region 212 and a fourth $N^+$ region 214 formed in the P-body 206.

In the ESD protection device 100, the P-type substrate 202 may be a P-type silicon substrate or a P-type silicon-on-insulator substrate. The HV N-Well 204 can be formed by incorporating N-type impurities, such as antimony, arsenic, or phosphorous, into the P-type substrate 202 by, for example, ion implantation. In some embodiments, an impurity concentration, i.e., doping level, in the HV N-Well 204 is about $1 \times 10^{10}$ to about $1 \times 10^{16}$ cm$^{-1}$. The P-body 206 may be formed by incorporating P-type impurities, such as boron, aluminum, or gallium, into the HV N-Well 204 by, for example, ion implantation. In some embodiments, an impurity concentration, i.e., doping level in the P-body 206 is about $1 \times 10^{12}$ cm$^{-3}$ to about $1 \times 10^{20}$ cm$^{-3}$. The first and second N-Wells 208-1 and 208-2 can be formed by incorporating additional N-type impurities into the HV N-Well 204. Therefore, impurity concentrations in the first and second N-Wells 208-1 and 208-2 are higher than the impurity concentration in the HV N-Well 204. In some embodiments, the impurity concentrations in the first and second N-Wells 208-1 and 208-2 are in the range from about $1 \times 10^{10}$ cm$^{-3}$ to about $1 \times 10^{16}$ cm$^{-3}$. The first and second $N^+$ regions 210-1 and 210-2 can be formed by incorporating additional N-type impurities into the first and second N-Wells 208-1 and 208-2, respectively. In some embodiments, impurity concentrations in the first and second N⁺ regions 210-1 and 210-2 are in the rage from about $1\times10^{15}$ cm⁻³ to about $1\times10^{20}$ cm⁻³. The third and fourth N⁺ regions 212 and 214 can be formed by incorporating N-type impurities into the P-body 206. In some embodiments, an impurity concentration in the third N⁺ region 212 and that in the fourth N⁺ region 214 are in the range from about $1\times10^{15}$ cm⁻³ to about $1\times10^{20}$ cm⁻³. In some embodiments, the N⁺ regions 210-1, 210-2, 212, and 214 are formed in the same doping step, such as the same ion implantation step.

The ESD protection device 100 also includes a continuous polysilicon layer 220 formed over the P-body 206 and a continuous thin oxide layer 222 formed between the polysilicon layer 220 and the P-body 206. As will be described below, different portions of the polysilicon layer 220 serve as gate electrodes of different MOS structures. Similarly, different portions of the thin oxide layer 222 serve as gate dielectric films of different MOS structures.

Consistent with embodiments of the disclosure, the first N-Well 208-1 serves as a first drain region of the HV MOS structure 102, and the second N-Well 208-2 serves as a second drain region of the HV MOS structure 102. The first and second N⁺ regions 210-1 and 210-2 serve as a first drain electrode and a second drain electrode, respectively, of the HV MOS structure 102.

Figure 3A:
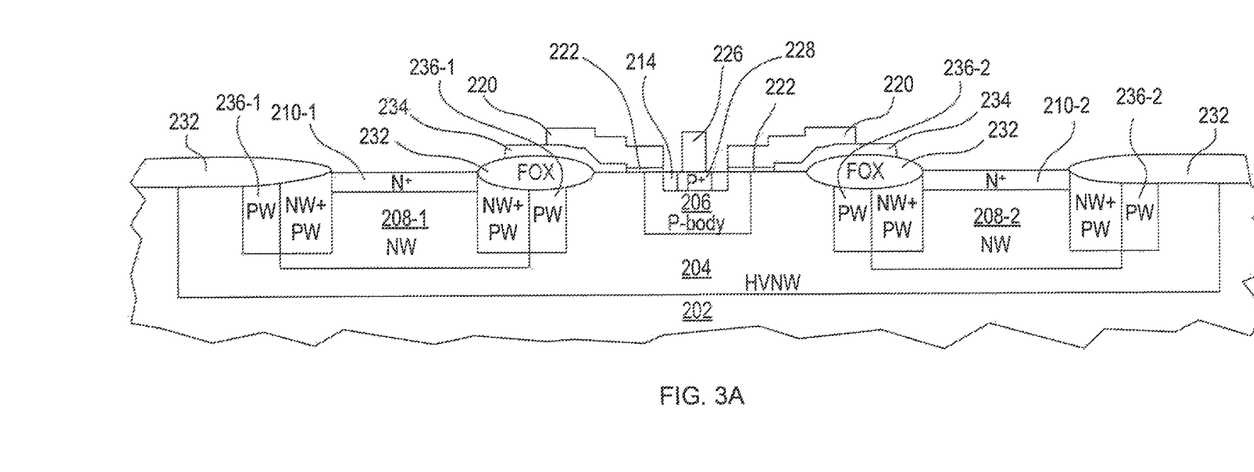
FIGS. 3A-3D are cross-sectional views of the ESD protection device according to the exemplary embodiment, taken along cut-lines AA', BB', CC', and DD', respectively, in FIG. 2.
Figure 3B:
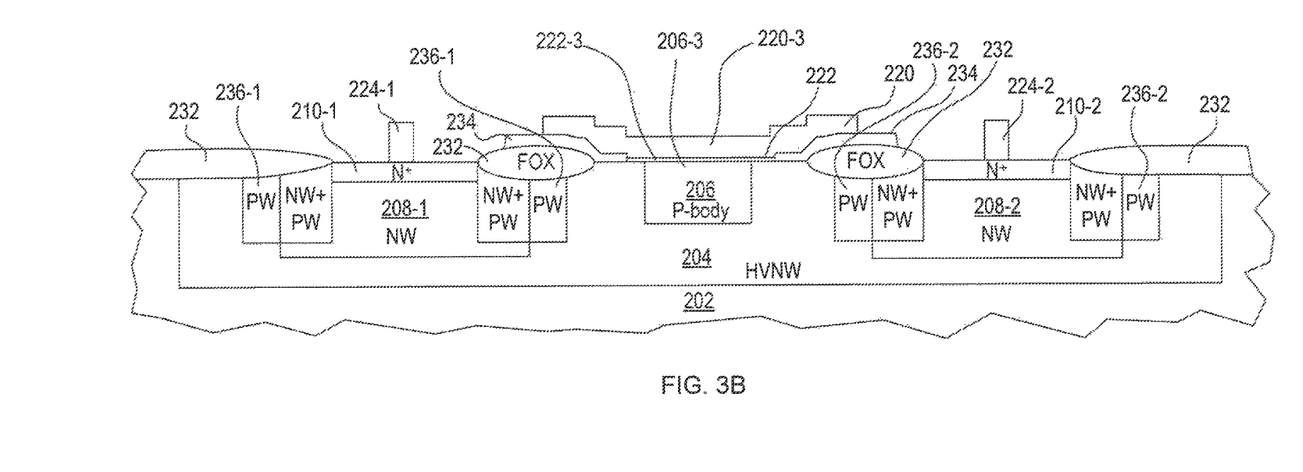
Figure 3C:
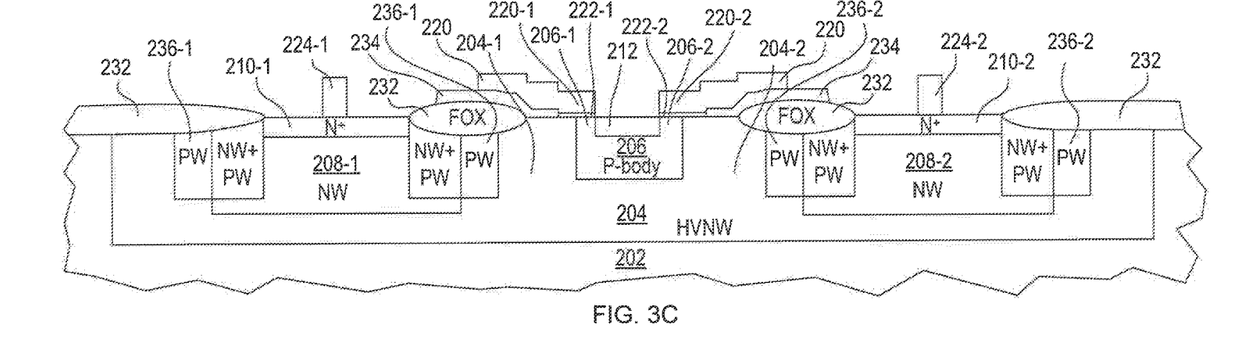

As shown in, e.g., FIG. 3C, the HV N-Well 204 includes a first HV N-Well portion 204-1 between the first N-Well 208-1 and the P-body 206, and a second HV N-Well portion 204-2 between the second N-Well 208-2 and the P-body 206. The first and second HV N-Well portions 204-1 and 204-2 serve as a first drift region and a second drift region, respectively, of the HV MOS structure 102. Similarly, the P-body 206 includes a first P-body portion 206-1 between the first HV N-Well portion 204-1 and the third N⁺ region 212, and a second P-body portion 206-2 between the second HV N-Well portion 204-2 and the third N⁺ region 212. The first and second P-body portions 206-1 and 206-2 serve as a first channel region and a second channel region, respectively, of the HV MOS structure 102. The third N⁺ region 212 serves as a source region of the HV MOS structure 102.

As shown in, e.g., FIG. 3C, the first N-Well 208-1, the first HV N-Well portion 204-1, the first P-body portion 206-1, the third N⁺ region 212, the second P-body portion 206-2, the second HV N-Well portion 204-2, and the second N-Well 208-2 are arranged along the X-direction, in that order. Moreover, the first and second N-Wells 208-1 and 208-2 are arranged approximately symmetrical to each other with respect to the third N⁺ region 212. The first and second HV N-Well portions 204-1 and 204-2 are arranged approximately symmetrical to each other with respect to the third N⁺ region 212. The first and second P-body portions 206-1 and 206-2 are arranged approximately symmetrical to each other with respect to the third N⁺ region 212.

As shown in, e.g., FIG. 3C, the polysilicon layer 220 includes a first polysilicon portion 220-1 serving as a first gate electrode of the HV MOS structure 102 and a second polysilicon portion 220-2 serving as a second gate electrode of the HV MOS structure 102. Correspondingly, the thin oxide layer 222 includes a first thin oxide portion 222-1 and a second thin oxide portion 222-2, serving as a first gate dielectric film and a second gate dielectric film, respectively, of the HV MOS structure 102.

Figure 3D:
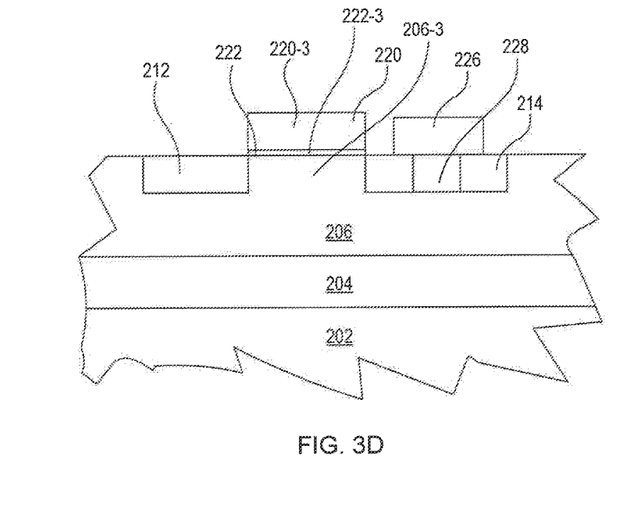

Refer to FIG. 3D, the third N⁺ region 212 also serves as a drain region of the LV MOS structure 104. The fourth N⁺ region 214 serves as a source region of the LV MOS structure 104. The P-body 206 further includes a third P-body portion 206-3, serving as a channel region of the LV MOS structure 104. The polysilicon layer 220 further includes a third polysilicon portion 220-3, serving as a gate electrode of the LV MOS structure 104. Correspondingly, the thin oxide layer 222 further includes a third thin oxide portion 222-3, serving as a gate dielectric film of the LV MOS structure 104. As shown in FIG. 3D, the third N⁺ region 212, the third P-body portion 206-3, and the fourth N⁺ region 214 are arranged along the Y-direction, in that order.

Consistent with embodiments of the disclosure, the ESD protection device 100 further includes first drain contacts 224-1 formed over and electrically coupled to the first N⁺ region 210-1, and second drain contacts 224-2 formed over and electrically coupled to the second N⁺ region 210-2. The first and second drain contacts 224-1 and 224-2 are electrically coupled to the power supply terminal 106 (not shown in FIGS. 2 and 3A-3D). In some embodiments, the first and second drain contacts 224-1 and 224-2 are formed by depositing a metal, such as aluminum, on the first and second N⁺ regions 210-1 and 210-2, respectively. In the example shown in FIGS. 2 and 3A-3D, multiple discrete first drain contacts 224-1 and multiple discrete second drain contacts 224-2 are respectively formed over the first and second N⁺ regions 210-1 and 210-2. However, in other embodiments, a continuous first drain contact and a continuous second drain contact can be formed over the first and second N⁺ regions 210-1 and 210-2, respectively.

The ESD protection device 100 further includes a contact 226 formed over and electrically coupled to the fourth N⁺ region 214. The contact 226 electrically couples the fourth N⁺ region 214 to the circuit ground terminal 108 (not shown in FIGS. 2 and 3A-3D), and thus serves as a source contact of the ESD protection device 100.

As shown in FIG. 1A, the body 102-8 of the HV MOS 102 and the body 104-8 of the LV MOS 104 are electrically coupled to each other and are also electrically coupled to the circuit ground terminal 108. As shown in FIGS. 3A-3D, the channel regions, and thus bodies, of the HV MOS 102 and the LV MOS 104 consist of different parts of the continuous P-body 206, and thus are electrically coupled to each other. The ESD protection device 100 further includes a P⁺ region 228 formed in the fourth N⁺ region 214. The P⁺ region 228 serves as a body electrode of the ESD protection device 100, i.e., a connection region electrically coupling the P-body 206 to the contact 226. In this regard, the contact 226 also serves as a body contact of the ESD protection device 100.

In some embodiments, the contact 226 is formed by depositing a metal, such as aluminum, on the fourth N⁺ region 214 and the P⁺ region 228. It is noted that in the ESD protection device 100, no contact is formed over and electrically coupled to the third N⁺ region 212.

In the ESD protection device 100, gate contacts 230 are formed over and electrically coupled to the polysilicon layer 220, and are therefore electrically coupled to the gate electrodes of the HV MOS structure 102 and the LV MOS structure 104. The gate contacts 230 are electrically coupled to the internal circuit 110 (not shown in FIGS. 2 and 3A-3D) that is protected by the ESD protection device 100.

Therefore, as described above, the HV MOS structure 102 is formed in the substrate 202 with different functional regions arranged along the X-direction, while the LV MOS structure 104 is formed in the substrate 202 with different functional regions arranged along the Y-direction. This arrangement is schematically illustrated in the plan view of FIG. 2. Moreover, the LV MOS structure 104 is formed utilizing a middle portion of the HV MOS structure 102. Therefore, no additional wafer area is needed for forming the LV MOS structure 104. Further, as mentioned above, the HV MOS structure 102 and the LV MOS structure 104 use a common semiconductor region, i.e., the third N+ region 212, as the source region and the drain region, respectively, and, as a result, are electrically coupled to each other without the need for additional wirings. As a consequence of the above-described arrangements, the size of the ESD protection device 100 is reduced, and no additional photolithographic mask is needed for manufacturing the ESD protection device 100 as compared to the manufacturing of a conventional ESD protection device that only includes an HV MOS structure.

Refer to FIGS. 2 and 3A-3D, the ESD protection device 100 also includes a field oxide layer 232 (also labeled as "FOX" in the figures) for isolation. In some embodiments, the field oxide layer 232 may be replaced by a shallow-trench isolation layer. As shown in FIGS. 2 and 3A-3D, thick oxide layers 234 are formed outside and next to the thin oxide layer 222. Portions of the thick oxide layers 234 overlap the field oxide layer 232. Moreover, portions of the polysilicon layer 220 overlap the thick oxide layers 234.

The ESD protection device 100 further includes a first P-Well 236-1 and a second P-Well 236-2 (both also labeled as "PW" in the figures) surrounding the first N-Well 208-1 and the second N-Well 208-2, respectively. As shown in FIGS. 3A-3C, the first P-Well 236-1 partially overlaps the first N-Well 208-1, and the second P-Well 236-2 partially overlaps the second N-Well 208-2. (The overlap regions are labeled as "NW+PW" in the figures.) Due to existence of the first and second P-Wells 236-1 and 236-2, currents between the first and second drain regions of the HV MOS structure 102 and the source region of the HV MOS structure 102 are forced to pass below the first and second P-Wells 236-1 and 236-2, and thus current paths between the first and second drain regions and the source region become longer. As a consequence, a breakdown voltage of the HV MOS structure 102, and thus a breakdown voltage of the ESD protection device 100, is increased. In some embodiments, the first and second P-Wells 236-1 and 236-2 are formed by incorporating P-type impurities into regions surrounding and partially overlapping the first and second N-Wells 208-1 and 208-2, respectively.

Figure 4A:
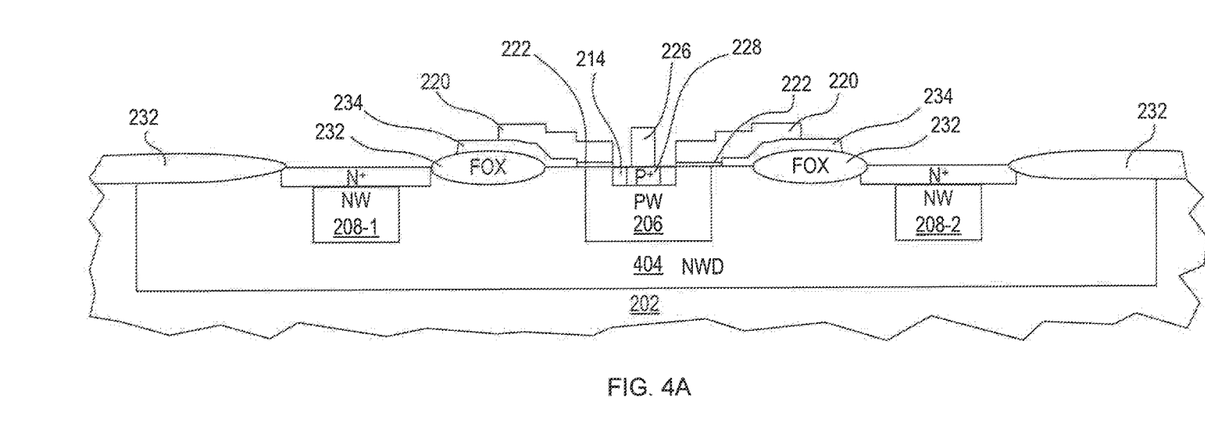
FIGS. 4A and 4B are cross-sectional views of an ESD protection device according to another exemplary embodiment.
Figure 4B:
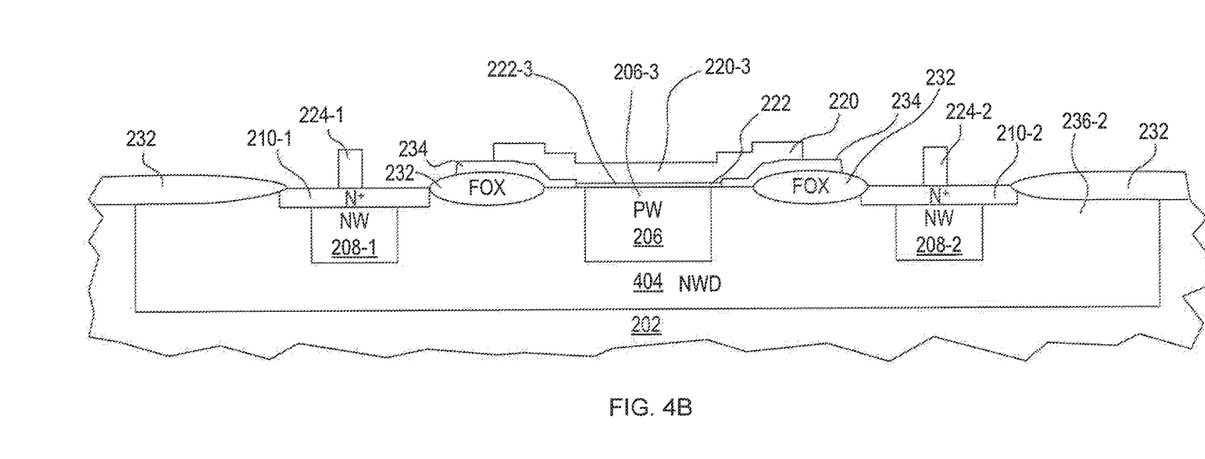

Consistent with embodiments of the disclosure, the HV N-Well 204 may be replaced by a deep N-Well that has a lower impurity concentration. FIGS. 4A and 4B are cross-sectional views schematically showing another exemplary HV ESD protection device 400 consistent with embodiments of the disclosure. A plan view of the ESD protection device 400 is the same as that of the ESD protection device 100 shown in FIG. 2, and thus is not shown. The cross-sectional views in FIGS. 4A and 4B are taken along cut-lines having locations and extending in directions similar to those of the out-lines AA' and BB', respectively, in FIG. 2A. In the ESD protection device 400, a deep N-Well 404 (also labeled as "NWD" in the figures) is formed instead of the HV N-Well 204 of the ESD protection device 100. An impurity concentration in the deep N-Well 404 is lower than that in the HV N-Well 204, and may be about $1 \times 10^{10}$ cm$^{-3}$ to about $1 \times 10^{16}$ cm$^{-3}$. Further, a depth of the deep N-Well 404 may be larger than a depth of the HV N-Well 204, and may be in the range from about 1 μm to about 10 μm. In some embodiments, the depth of the deep N-Well 404 is in the range from about 1 μm to about 5 μm. Another difference between the ESD protection device 400 and the ESD protection device 100 is that the ESD protection device 400 does not have the P-Wells 236-1 and 236-2. However, since the impurity concentration in the deep N-Well 404 is lower than the impurity concentration in the HV N-Well 204, a breakdown voltage of the ESD protection device 400 may still be maintained at a relatively high level even without using the P-Wells 236-1 and 236-2 as the ESD protection device 100 does.

Figure 5A:
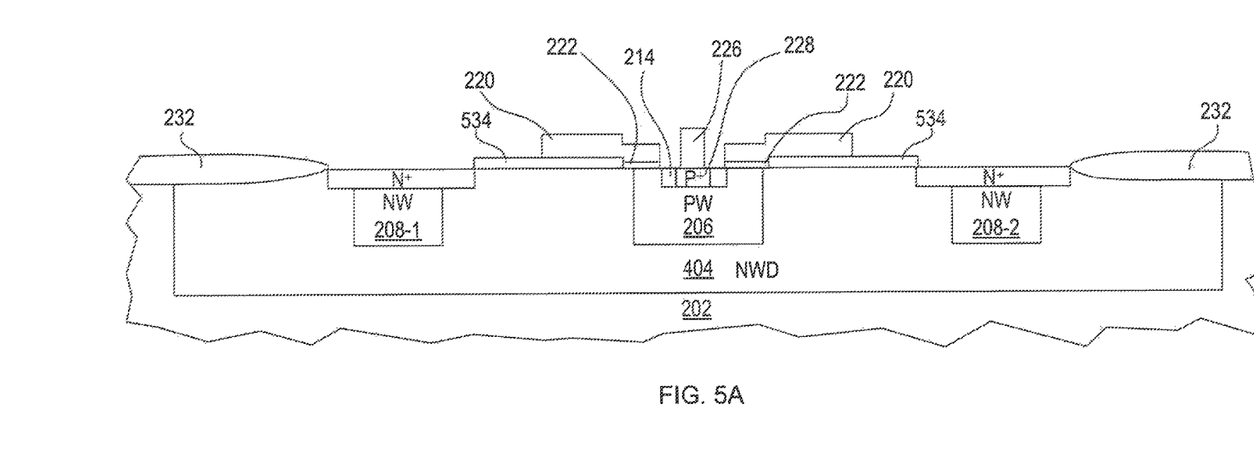
FIGS. 5A and 5B are cross-sectional views of an ESD protection device according to a further exemplary embodiment.
Figure 5B:
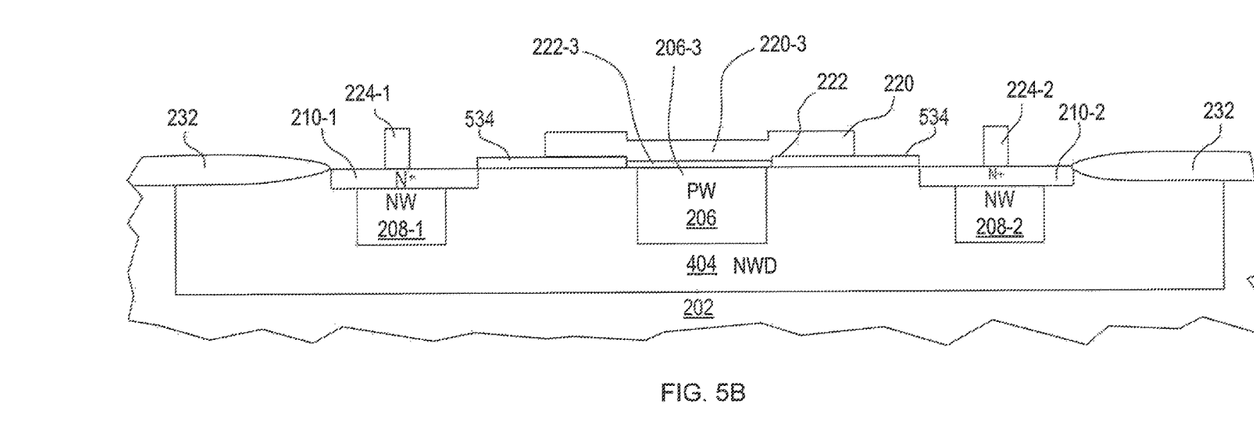

FIGS. 5A and 5B are cross-sectional views schematically showing a further exemplary HV ESD protection device 500 consistent with embodiments of the disclosure. The cross-sectional views in FIGS. 5A and 5B are taken along cut-lines having locations and extending in directions similar to those of the cut-lines AA' and BB', respectively, in FIG. 2A. The ESD protection device 500 is similar to that of the ESD protection device 400, except that no field oxide layer is formed between the first N+ region 210-1 and the P-body 206, or between the second N+ region 210-2 and the P-body 206. Instead, an entire surface area between the first N+ region 210-1 and the P-body 206 and an entire surface area between the second N+ region 210-2 and the P-body 206 are covered by thick oxide layers 534. An on-state resistance $R_{DS-on}$ of the ESD protection device 500 is lower than that of the ESD protection device 400.

Comparisons between electrical characteristics of a conventional ESD protection device and electrical characteristics of an HV ESD protection device consistent with embodiments of the disclosure (also referred to as "novel ESD protection device") are shown in FIGS. 6A, 6B, 7A, and 7B.

Figure 6A:
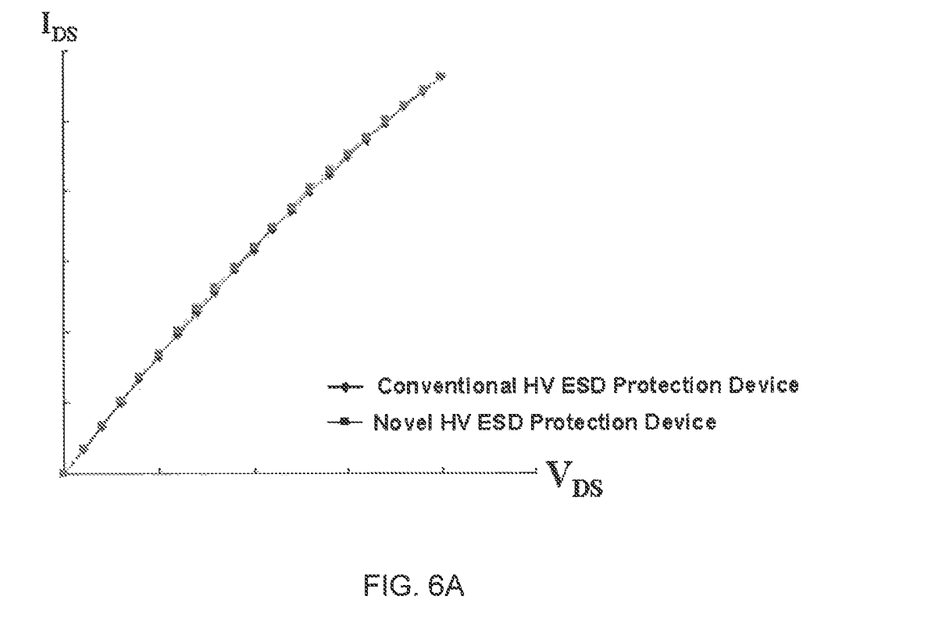
FIGS. 6A and 6B show measured current-voltage curves of a conventional ESD protection device and an ESD protection device consistent with embodiments of the disclosure.
Figure 6B:
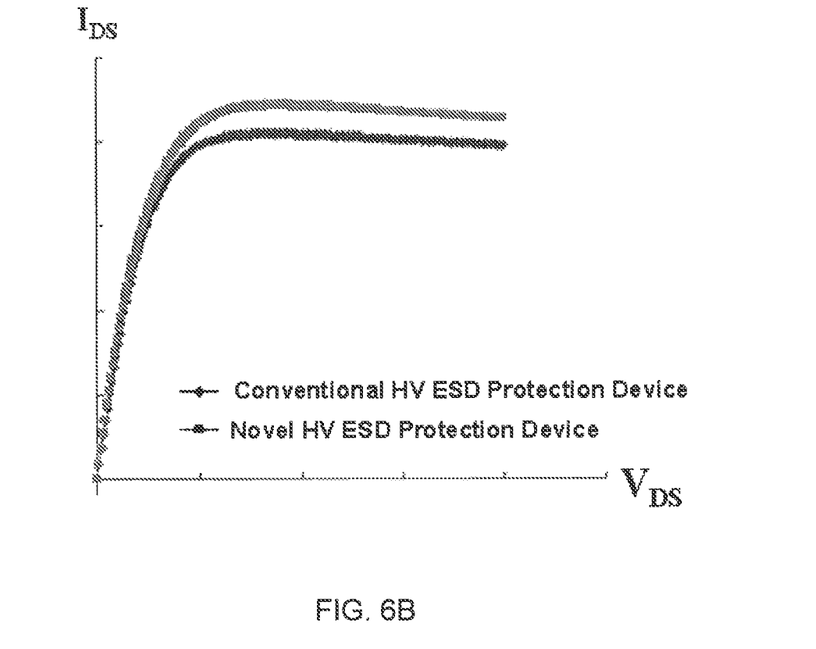

Specifically, FIGS. 6A and 6B show actually-measured $I_{DS-on}$ curves (where "$I_{DS}$" refers to drain current and "$V_{DS}$" refers to drain voltage) of the conventional ESD protection device and the novel ESD protection device. FIG. 6A shows the linear regions of the $I_{DS}$-$V_{DS}$ curves, while FIG. 6B shows both the linear regions and the saturation regions of the $I_{DS}$-$V_{DS}$ curves. As seen from FIG. 6A, in the linear regions, the same $V_{DS}$, $I_{DS}$ of the novel ESD protection device is larger than $I_d$ of the conventional ESD protection device. Further, when $V_{DS}$ increases, $I_{DS}$ of the novel ESD protection device increases faster as compared to $I_d$ of the conventional ESD protection device. This means that an on-state resistance, $R_{DS-on}$, of the novel ESD protection device is smaller than $R_{DS-on}$ of the conventional ESD protection device. Moreover, as seen from FIG. 6B, when the devices enter into the saturation region, $I_{DS}$ of the novel ESD protection device is higher than $I_d$ of the conventional ESD protection device. That is, a saturation current, $I_{DS-sat}$, of the novel ESD protection device is higher than $I_{DS-sat}$ of the conventional ESD protection device. In summary, as shown in FIGS. 6A and 6B, the novel ESD protection device can handle larger current when an ESD event occurs, as compared to the conventional ESD protection device.

Figure 7A:
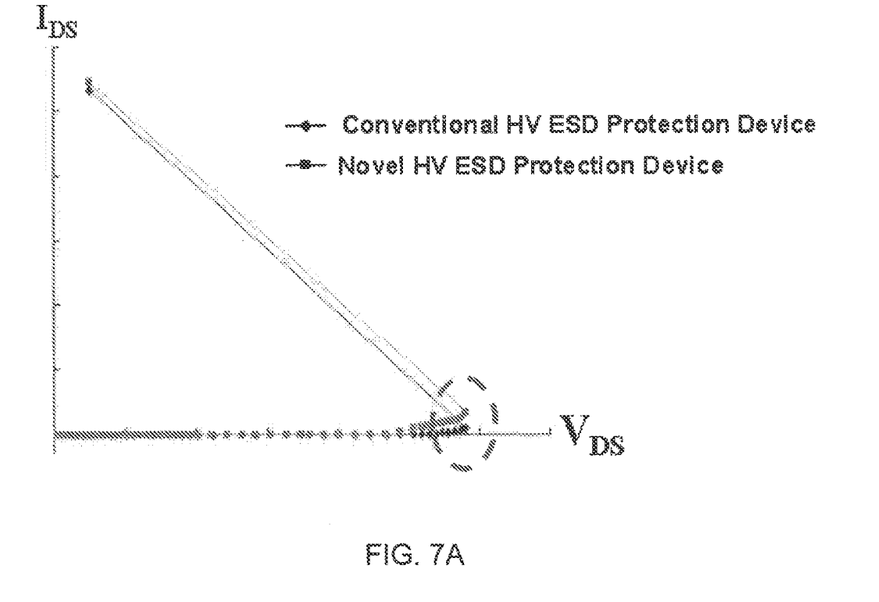
FIGS. 7A and 7B show measured transmission line pulse curves of the conventional ESD protection device and the ESD protection device consistent with embodiments of the disclosure.
Figure 7B:
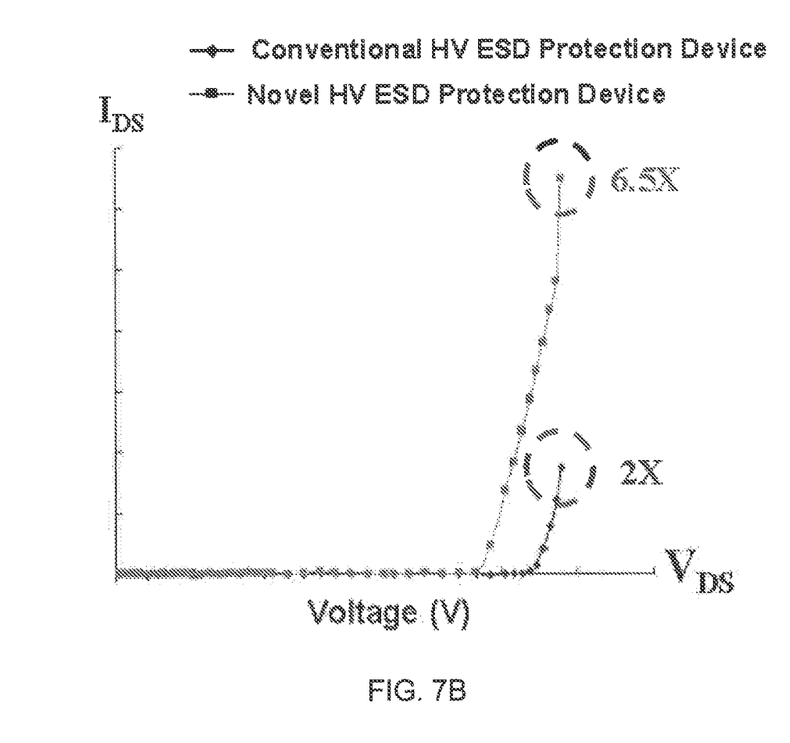

Transmission line pulse (TLP) test was performed to evaluate the ESD protection performance of devices consistent with embodiments of the disclosure and that of conventional devices. FIG. 7A shows TLP curves of the conventional ESD protection device and the novel ESD protection device. FIG. 7B is an enlarged view of the TLP curves, showing details of the portions where snapback occurs, i.e., where the devices are triggered to turn on (the circled region in FIG. 7A). In FIGS. 7A and 7B, the horizontal axis represents $V_{DS}$ and the vertical axis represents $I_{DS}$. As seen in FIGS. 7A and 7B, when snapback occurs, $I_{DS}$ of the novel ESD protection device is higher than $I_{DS}$ of the conventional ESD protection device. That is, the novel ESD protection device has a higher trigger current than the conventional ESD protection device. Therefore, latch-up is less likely to occur in the novel ESD protection device.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device comprising:
   a substrate;
   a high-voltage (HV) metal-on-semiconductor (MOS) structure formed in the substrate, the HV MOS structure including:
      a first semiconductor region having a first-type conductivity and a first doping level, the first semiconductor region being a drain region of the HV MOS structure;
      a second semiconductor region having the first-type conductivity and a second doping level lower than the first doping level, the second semiconductor region being a drift region of the HV MOS structure;
      a third semiconductor region having a second-type conductivity, the third semiconductor region being a channel region of the HV MOS structure; and
      a fourth semiconductor region having the first-type conductivity, the fourth semiconductor region being a source region of the HV MOS structure,
      wherein the first, second, third, and fourth semiconductor regions are arranged along a first direction in this order;
   a low-voltage (LV) MOS structure formed in the substrate, the LV MOS structure including:
      a fifth semiconductor region having the second-type conductivity, the fifth semiconductor region being a channel region of the LV MOS structure; and
      a sixth semiconductor region having the first-type conductivity, the sixth semiconductor region being a source region of the LV MOS structure,
      wherein:
         the fourth semiconductor region is a drain region of the LV MOS structure, and
         the fourth, fifth, and sixth semiconductor regions are arranged along a second direction different from the first direction in this order.

2. The semiconductor device according to claim 1, wherein the second direction is perpendicular to the first direction.

3. The semiconductor device according to claim 1, wherein:
   the first semiconductor region is a first drain region of the HV MOS structure,
   the second semiconductor region is a first drift region of the HV MOS structure, and
   the third semiconductor region is a first channel region of the HV MOS structure,
   the HV MOS structure further including:
      a seventh semiconductor region having the second-type conductivity, the seventh semiconductor region being a second channel region of the HV MOS structure, the third and seventh semiconductor regions being arranged symmetrical to each other with respect to the fourth semiconductor region;
      an eighth semiconductor region having the first-type conductivity and a third doping level, the eighth semiconductor region being a second drift region of the HV MOS structure, the second and eighth semiconductor regions being arranged symmetrical to each other with respect to the fourth semiconductor region; and
      a ninth semiconductor region having the first-type conductivity and a fourth doping level higher than the third doping level, the ninth semiconductor region being a second drain region of the HV MOS structure, and the first and ninth semiconductor regions being arranged symmetrical to each other with respect to the fourth semiconductor region.

4. The semiconductor device according to claim 3, wherein:
   the first doping level approximately equals the fourth doping level, and
   the second doping level approximately equals the third doping level.

5. The semiconductor device according to claim 3, wherein the second and eighth semiconductor regions are parts of a continuous well having the first-type conductivity and formed in the substrate.

6. The semiconductor device according to claim 1, further comprising:
   a first gate dielectric film formed over the third semiconductor region;
   a first gate electrode formed over the first gate dielectric film;
   a second gate dielectric film formed over the fifth semiconductor region; and
   a second gate electrode formed over the second gate dielectric film.

7. The semiconductor device according to claim 6, wherein:
   the third and fifth semiconductor regions are parts of a continuous well having the second-type conductivity and formed in the substrate,
   the first and second gate dielectric films are parts of a continuous thin dielectric film formed over the substrate, and
   the first and second gate electrodes are parts of a continuous polysilicon layer formed over the thin dielectric film.

8. The semiconductor device according to claim 1, further comprising:
   a drain contact formed over the first semiconductor region; and
   a source contact formed over the sixth semiconductor region.

9. The semiconductor device according to claim 8, wherein no contact is formed over the fourth semiconductor region.

10. The semiconductor device according to claim 1, wherein:
    the first-type conductivity is an N-type conductivity, and
    the second-type conductivity is a P-type conductivity.

11. The semiconductor device according to claim 10,
    wherein the first semiconductor region includes an N-type well (N-Well),
    the semiconductor device further comprising:
       a heavily doped N-type layer formed in or over the N-Well, the heavily doped N-type layer having a third doping level higher than the first doping level.

12. The semiconductor device according to claim 11, wherein:
    the substrate is a P-type substrate,
    the N-Well is a first N-Well,
    the second semiconductor region is a portion of a second N-Well formed in the P-type substrate, and
    the first N-Well is formed in the second N-Well.

13. The semiconductor device according to claim 12, wherein the third and fifth semiconductor regions are parts of a continuous P-type well (P-Well) formed in the second N-Well.

14. The semiconductor device according to claim 12, wherein the second N-Well is an HV N-Well, in which the second doping level is about $1\times10^{10}$ cm$^{-3}$ to about $1\times10^{16}$ cm$^{-3}$.

15. The semiconductor device according to claim 14, further comprising:

a P-type well (P-Well) formed in the second N-Well and surrounding the first N-Well.

16. The semiconductor device according to claim 15, wherein a portion of the P-Well overlaps with a portion of the first N-Well.

17. The semiconductor device according to claim 1, further comprising:
   a connection region having the second conductivity type and formed in the sixth semiconductor region, a doping level in the connection region being higher than a doping level in the fifth semiconductor region, and the connection region being in contact with and electrically connected to the fifth semiconductor region.

18. The semiconductor device according to claim 17, further comprising:
   a source contact formed in contact with and electrically connected to both the sixth semiconductor region and the connection region.

19. A semiconductor device comprising:
   a substrate;
   a high-voltage (HV) metal-on-semiconductor (MOS) structure formed in the substrate, the HV MOS structure including a first drain region, a first channel region, and a first source region arranged along a first direction in this order; and
   a low-voltage (LV) MOS structure formed in the substrate, the LV MOS structure including a second drain region, a second channel region, and a second source region arranged along a second direction different from the first direction in this order,
   wherein the first source region and the second drain region share a common semiconductor region in the substrate.

20. A semiconductor device comprising:
   a substrate; and
   a first, a second, a third, a fourth, a fifth, and a sixth semiconductor regions formed in the substrate,
   wherein:
      the first, second, third, and fourth semiconductor regions are arranged along a first direction in this order,
      the fourth, fifth, and sixth semiconductor regions are arranged along a second direction different from the first direction in this order,
      the first semiconductor region has a first-type conductivity and a first doping level,
      the second semiconductor region has the first-type conductivity and a second doping level lower than the first doping level,
      the third semiconductor region has a second-type conductivity,
      the fourth semiconductor region has the first-type conductivity,
      the fifth semiconductor region has the second-type conductivity, and
      the sixth semiconductor region has the first-type conductivity.

* * * * *